United States Patent
Harlan et al.

(10) Patent No.: US 7,654,828 B1
(45) Date of Patent: Feb. 2, 2010

(54) SOCKET WITH CONTACT FOR BEING SOLDERED TO PRINTED CIRCUIT BOARD

(75) Inventors: Tod M. Harlan, Mechanicsburg, PA (US); Terrance F. Little, York, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 3 days.

(21) Appl. No.: 12/284,206

(22) Filed: Sep. 19, 2008

(51) Int. Cl.
*H01R 12/00* (2006.01)

(52) U.S. Cl. .................................. 439/66; 439/83

(58) Field of Classification Search ............ 439/66, 439/71, 83, 874–875
See application file for complete search history.

(56) References Cited

U.S. PATENT DOCUMENTS

| | | | | |
|---|---|---|---|---|
| 6,257,899 B1* | 7/2001 | Walkup | ........................ | 439/66 |
| 6,994,565 B2* | 2/2006 | Harper, Jr. | .................... | 439/66 |
| 7,128,622 B2* | 10/2006 | Tsai | ............................ | 439/874 |
| 2008/0050940 A1 | 2/2008 | Lin et al. | | |

\* cited by examiner

*Primary Examiner*—Khiem Nguyen
(74) *Attorney, Agent, or Firm*—Andrew C. Cheng; Wei Te Chung; Ming Chieh Chang

(57) ABSTRACT

A socket, adapted for electrically connecting a printed circuit board to an IC package, comprises a housing and a plurality of contacts arranged in an angular fashion within the passageways. The housing defines a mating face and a mounting face opposed to the mating face and a number of angular passageways extending from the mating face to the mounting face. Each contact includes a bend portion, a first leg and a second leg extending from two opposed ends of the bend portion. The second leg has an arc contacting portion extending out of the mating face for contacting with the IC package. Firstly a solder ball is disposed on a bottom surface of the bend portion and soldered to the printed circuit board to mount the contact to the printed circuit board. Or secondly the contacts (Mounting end) have no solder balls and solder paste is applied to PCB then connector is placed onto PCB and reflow soldered into place without use of solder balls.

4 Claims, 5 Drawing Sheets

SOCKET WITH CONTACT FOR BEING SOLDERED TO PRINTED CIRCUIT BOARD

BACKGROUND OF THE INVENTION

1. Field of the Invention

The present invention relates to the art of electrical connector, and more specifically to a socket for electrically interconnecting two electrical interfaces, such as an IC (Integrated Circuit) package and a printed circuit board.

2. Description of the Prior Art

Generally speaking, a connector to which this invention is applicable is interposed between first and second electronic parts or components having contact pads, respectively, to achieve electrical connection between the first and the second electronic components. In the following description, the first and the second electronic components are a printed circuit board and an IC Package, respectively.

A conventional connector, referring to Korsunsky U.S. Pat. No. 6,447,304 issued to Huang et al. on Sep. 12, 2002, comprises a housing, and a plurality of contacts received in the housing. Each contact is formed by punching and bending an elastic metal plate, so that each contact comprises a generally U-shaped portion comprising a first leg portion, a second leg portion, a bridge portion connecting top ends of the first and the second leg portions and an extension portion obliquely and downwardly extending from a bottom end of the first leg portion. The extension portion has a curved end portion as a lower end portion and a first contact point formed on the curved end portion to be brought into contact with the contact pad of the printed circuit board. The bridge portion has a second contact point on its top portion to be brought into contact with the contact pad of the IC package. The contact is inserted into corresponding contact receptacle hole defined on the housing and held at a predetermined position.

SUMMARY OF THE INVENTION

An object of the present invention is to provide a socket, which have a plurality of contacts adapted for being soldered to a printed circuit board to which the socket is mounted.

To fulfill the above object, a socket, adapted for electrically connecting a printed circuit board to an IC package, comprises a housing defining a mating face and a mounting face opposed to the mating face and a plurality of passageways extending through the mating face and the mounting face; and a plurality of contacts arranged in the passageways, each including a bend portion, a first leg and a second leg extending from two opposed ends of the bend portion, the second leg having an arc contacting portion extending out of the mating face for contacting the IC package, the bend portion being soldered to the printed circuit board.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Reference is now made to the drawings to describe the invention in detail.

Figure 1:
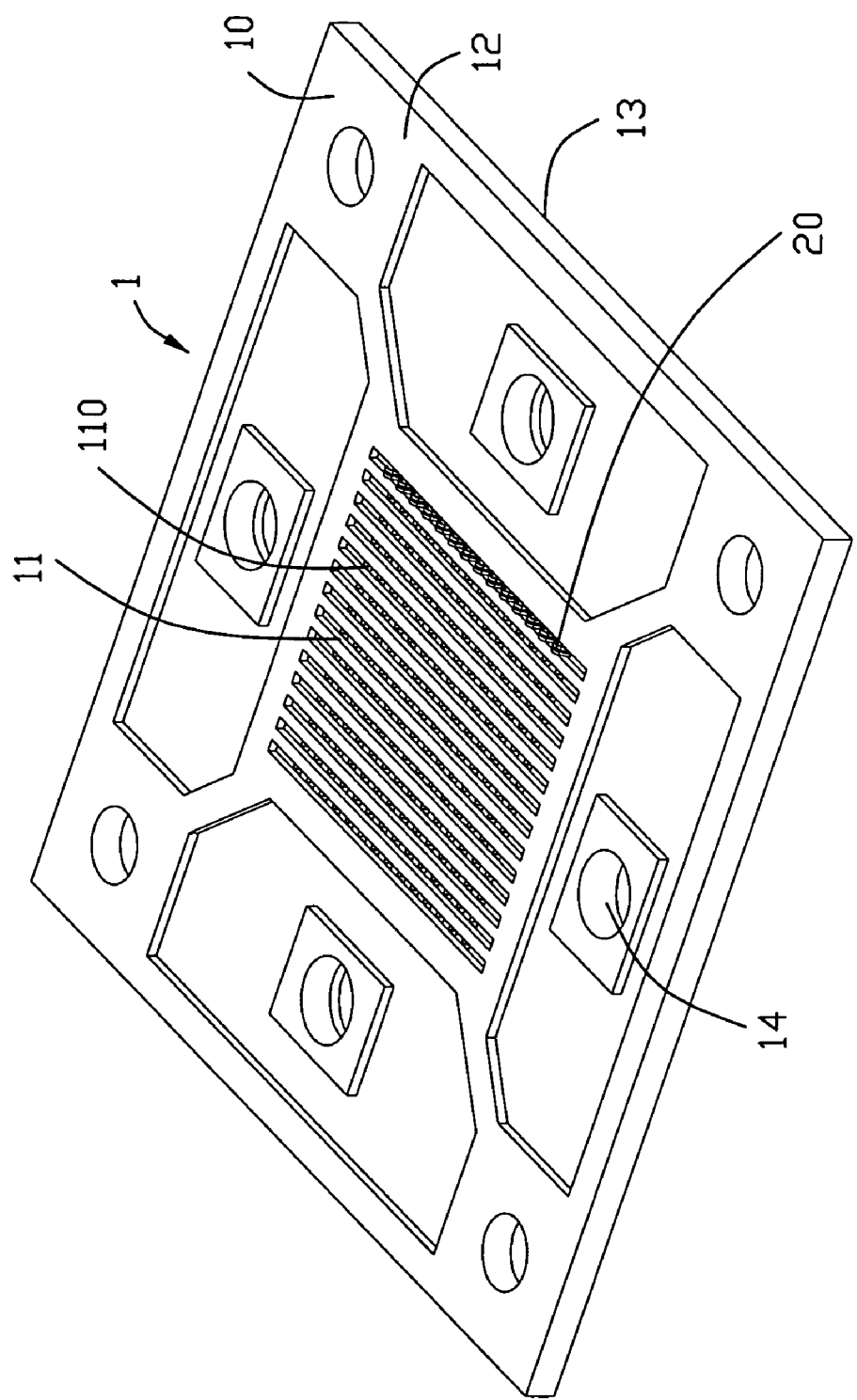
FIG. 1 is an assembled, perspective view of a socket in accordance with a preferred embodiment of the invention.
Figure 4:
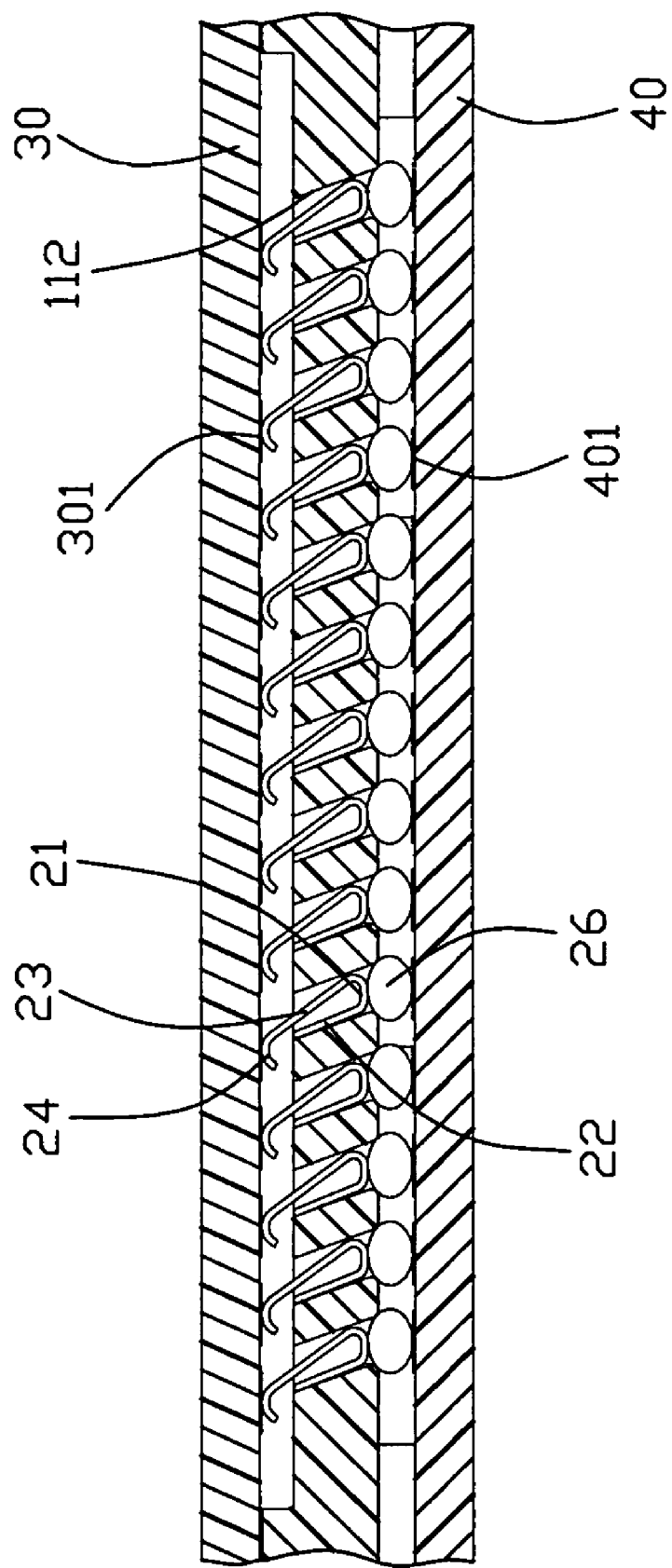
FIG. 4 is another sectional view of the socket, showing the socket electrically connecting the printed circuit board with the IC package.

Referring to FIGS. 1 and 4, a socket 1 in accordance with a preferred embodiment of the present invention is arranged between an IC package 30 having a plurality of conductive pads 301 thereon and a printed circuit board 40 having a plurality of conductive pads 401 thereon.

Referring to FIG. 1, the socket 1 includes a housing 10 and a plurality of contacts 20. The housing 10 has a conductive field 11, which defines a plurality of through passageways 110 arranged in longitude rows and adapted for receiving the contacts 20. The housing 10 has a mating face 12 toward the IC package 30 and a mounting face 13 opposed to the mating face 12 and toward the printed circuit board 40. The housing 10 further has a plurality of mounting holes 14 on a peripheral thereof.

Figure 2:
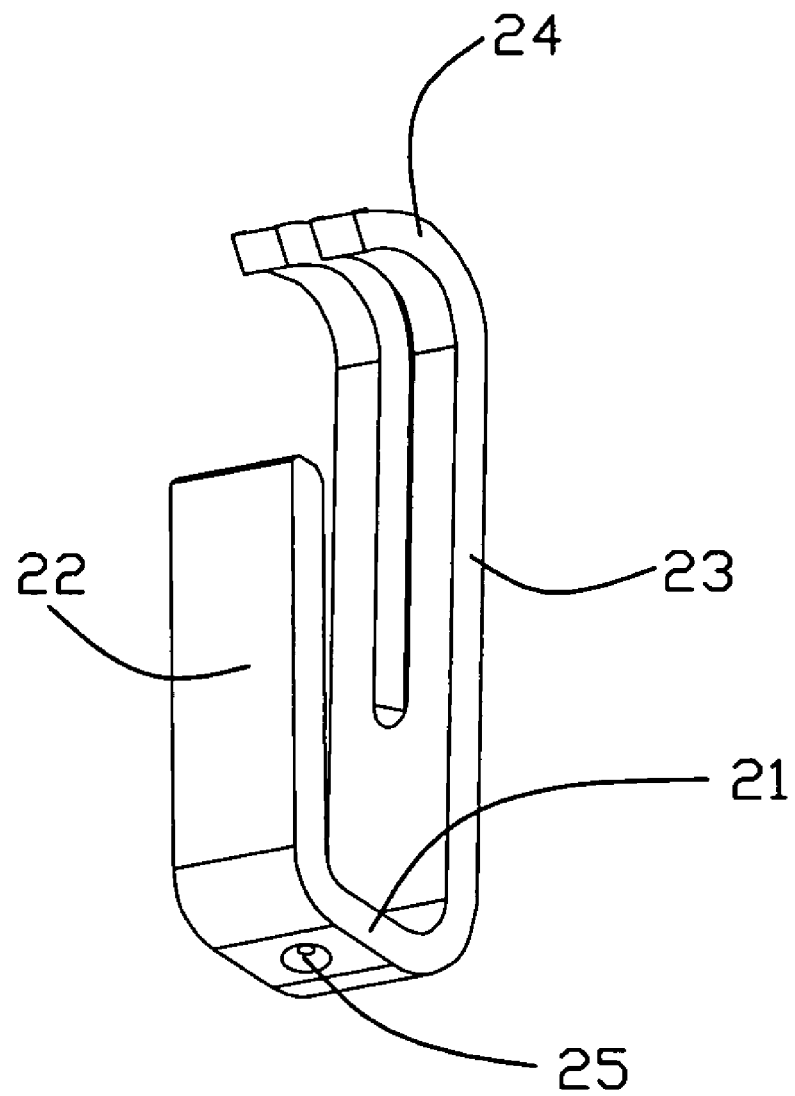
FIG. 2 is a perspective view of a contact of the socket shown in FIG. 1.

Referring to FIG. 2, showing the contact 20 in a vertical state, the contact 20 is stamped from a metal plane and substantially bent to a U-shape, including a bend portion 21, a first leg 22 and a second leg 23 extending from two opposed ends of the bend portion 21. The second leg 23 is longer than the first leg 22 and is formed with an arc contacting portion 24 on a free end thereof, which approximately faces to the bend portion 21 in a vertical direction in FIG. 2.

The bend portion 21 is adapted for being soldered to the printed circuit board 40, and the contacting portion 24 is adapted for contacting with the IC package 30. The contact 20 has a substantial slit along its center line thereof. The slit is from the contacting portion 24 end, except that a portion of the two parts is allowing the bend portion 21 and first leg 22 to remain intact as a one piece configuration. So, the contacting portion 24 has two contacting segments. Furthermore, the bend portion 21 can contain a coined recess 25 on the bottom surface thereof.

Figure 3:
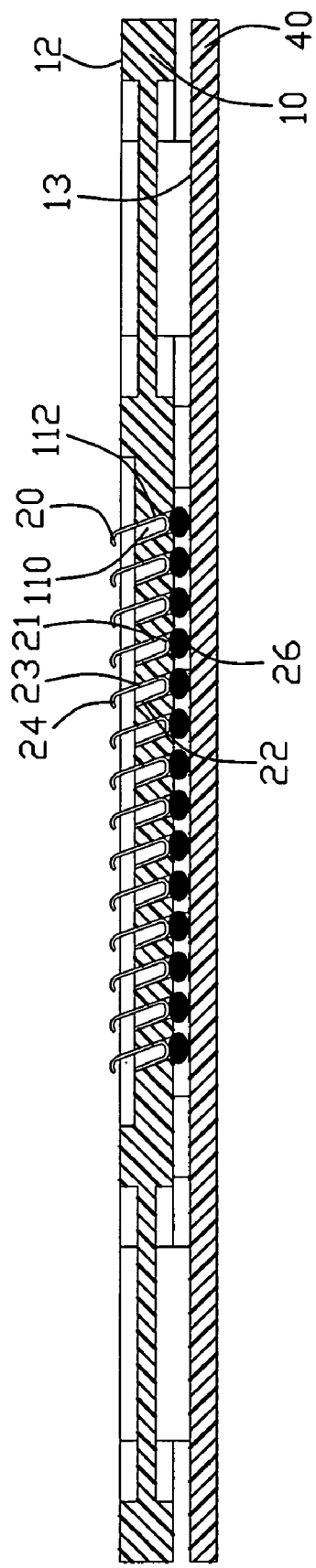
FIG. 3 is a sectional view of the socket mounted to a printed circuit board.

Referring to FIG. 3, the passageway 110 of the housing 10 angularly extends through the mating face 12 and the mounting face 13 and defines two opposing inner sidewalls 112 thereof for supporting the contact 20. The contact 20 is inserted into and retained in the passageway 110 in a angular state, with the first leg 22 and the second leg 23 abutting against the two inner sidewalls 112 of the passageway 110, respectively, the contacting portion 24 of the second leg 23 extends beyond the mating face 12, while the first leg 22 remains in the passageway 110. Then, a solder ball 26 is attached to the bend portion 21 aided in positions by the recess 25. (Referring to FIG. 5) The structure is the same as FIG. 3 except the contacts (Mounting end) do not have solder balls attached. Mounting to the PCB is completed by applying solder paste to the PCB, applying connector & reflowing instead of using solder balls.

Referring to FIG. 4, the socket 1 electrically connects the IC package 30 and the printed circuit board 40. The bend portions 21 are soldered to the printed circuit board 40 by the solder balls 26. When the printed circuit board package 40 mounts to the socket 1, the IC package 30 contacts with the contacting portions 24 and downwardly presses the second legs 23, then the second legs 23 will deflect toward the first leg 22, while the first leg 22 keeps immobile.

Figure 5:
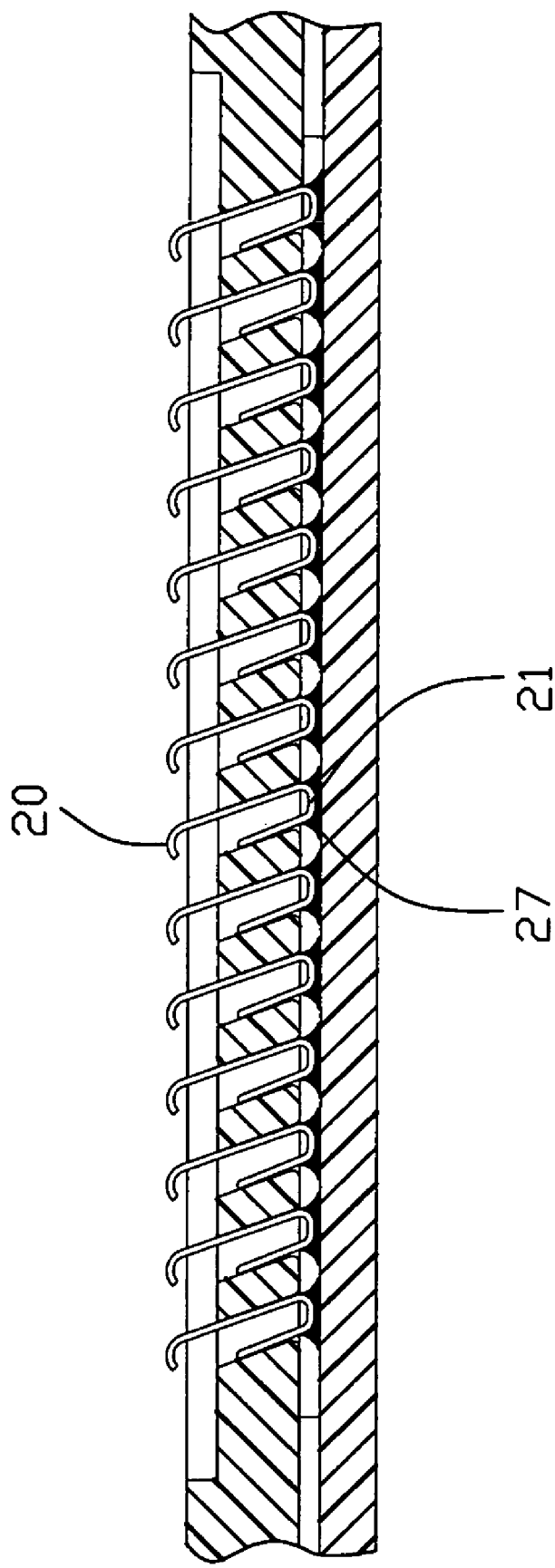
FIG. 5 is similar with FIG. 3, except the solder balls in FIG. 3 have been replaced by solder.

Referring to FIG. 5, in an alternative preferred embodiment of the present invention, the bend portion 21 of the contact 20 also can be soldered to the printed circuit board 40 by SMT (surface mounting technology), and a solder 27 is pre-assembled on the bottom surface of the bend portion 21.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A socket, adapted for electrically connecting a printed circuit board to an IC package, comprising: a housing defining a mating face and a mounting face opposed to the mating face and a plurality of angular passageways extending from the mating face to the mounting face; and a plurality of contacts arranged in an angular fashion within the passageways, each including a bend portion, a first leg and a second leg extending from two opposed ends of the bend portion, the second leg having an arc contacting portion extending out of the mating face for contacting the IC package, the bend portion for being soldered to the printed circuit board, wherein a solder ball is deposited on the bend portion of the contact, wherein the passageway angularly extends, so the contact is inserted into and retained in the passageway in an angular state, and the second leg bends toward the first leg when the IC package compresses the contact, while the first leg remains immobile, wherein the first leg and the second leg abut against inner sidewalls of the passageway, respectively.

2. The socket of claim 1, wherein the contact has a recess on a bottom surface of the bend portion for positioning the solder ball.

3. A socket, adapted for electrically connecting a printed circuit board to an IC package, comprising: a housing defining a mating face and a mounting face opposed to the mating face and a plurality of angular passageways extending from the mating face to the mounting face; a plurality of contacts arranged in the passageways, each of the contacts having a bend portion, a first leg and a second leg to extend from two opposed ends of the bend portion, the second leg having an arc contacting portion on a free end thereof for contacting the IC package; and a plurality of solderable portions disposed on the bend portions of the contacts, wherein the passageway angularly extends, so the contact is inserted into and retained in the passageway in an angular state, and the second leg inclines toward the first leg when the IC package compresses the contact, while the first leg remains immobile, wherein the first leg and the second leg abut against inner sidewalls of the passageway, respectively.

4. An electrical connector assembly comprising: an insulative housing defining opposite upper and bottom surfaces thereon with a plurality of oblique passageways extending therethrough; a plurality of oblique type contacts disposed in the corresponding passageways, respectively; each of said contacts defining a U-shaped body with an upper long leg having contacting free end region to abut against an undersurface of an electronic package seated upon the upper surface, and a lower short leg downwardly abutting against the housing for holding the contact in the corresponding passageway, and a bight connected between the upper leg and the lower leg having a solder ball thereunder for soldering to a printed circuit board on which said housing is mounted; wherein the passageways angularly extend, so the contact is inserted into and retained in the passageway in an angular state, and the upper leg inclines toward the lower leg when the electronic package compresses the contact, while the lower leg remains immobile, wherein said contact is essentially floatable with regard to the housing for forgiving Thermal Coefficient of Expansion (TCE) under a condition that an oblique arrangement of the contact and the corresponding passageway still keep required retention between the contact and the housing without dropping.

* * * * *